(12) United States Patent
Imazato et al.

(10) Patent No.: US 7,345,892 B2
(45) Date of Patent: Mar. 18, 2008

(54) SEMICONDUCTOR DEVICE, NOISE REDUCTION METHOD, AND SHIELD COVER

(75) Inventors: Masaharu Imazato, Tokyo (JP); Atsushi Nakamura, Tokyo (JP); Takayuki Watanabe, Tokyo (JP); Kensuke Tsuneda, Tokyo (JP); Mitsuaki Katagiri, Tokyo (JP); Hiroya Shimizu, Tokyo (JP); Tatsuya Nagata, Tokyo (JP)

(73) Assignees: NEC Corporation, Tokyo (JP); Renesas Eastern Japan Semiconductor, Inc., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/134,132

(22) Filed: May 20, 2005

(65) Prior Publication Data

US 2005/0270758 A1 Dec. 8, 2005

(30) Foreign Application Priority Data

May 20, 2004 (JP) .............................. 2004-150915

(51) Int. Cl.
*H09K 9/00* (2006.01)
(52) U.S. Cl. ...................... 361/818; 361/753; 361/816; 361/800; 361/799; 174/350; 333/12

(58) Field of Classification Search ................ 361/818, 361/800, 816, 799, 753, 772, 779, 766, 730, 361/728, 736; 174/35 R, 35 GC, 520, 521, 174/260; 333/12
See application file for complete search history.

(56) References Cited

U.S. PATENT DOCUMENTS

| | | | | |
|---|---|---|---|---|
| 4,739,453 A | * | 4/1988 | Kurokawa | 361/816 |
| 5,633,786 A | * | 5/1997 | Matuszewski et al. | 361/818 |
| 5,949,654 A | * | 9/1999 | Fukuoka | 361/760 |
| 6,016,084 A | * | 1/2000 | Sugimoto | 333/12 |
| 6,037,846 A | * | 3/2000 | Oberhammer | 333/182 |
| 6,233,150 B1 | * | 5/2001 | Lin et al. | 361/704 |
| 6,297,966 B1 | * | 10/2001 | Lee et al. | 361/799 |
| 6,343,020 B1 | * | 1/2002 | Lin et al. | 361/816 |
| 6,362,966 B1 | * | 3/2002 | Ali et al. | 361/728 |
| 6,538,196 B1 | * | 3/2003 | MacDonald et al. | 174/377 |
| 6,683,245 B1 | * | 1/2004 | Ogawa et al. | 174/382 |
| 6,768,654 B2 | * | 7/2004 | Arnold et al. | 361/818 |

FOREIGN PATENT DOCUMENTS

| | | |
|---|---|---|
| JP | 10-98275 | 4/1998 |
| JP | 2000-251463 | 9/2000 |

* cited by examiner

*Primary Examiner*—Tuan T. Dinh
*Assistant Examiner*—Dameon E. Levi
(74) *Attorney, Agent, or Firm*—Scully, Scott, Murphy & Presser, P.C.

(57) ABSTRACT

In a memory module, reference potential connecting patterns are disposed on high frequency signal lines and/or on the extension lines extending from the terminal ends of the signal lines as well as a shield cover for covering semiconductor memory chips is disposed on the substrate, and the reference potential connecting patterns are connected to the shield cover through metal cover contact parts.

18 Claims, 8 Drawing Sheets

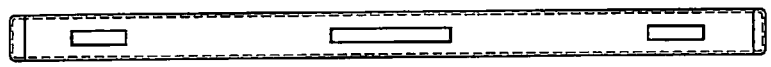
FIG. 7A
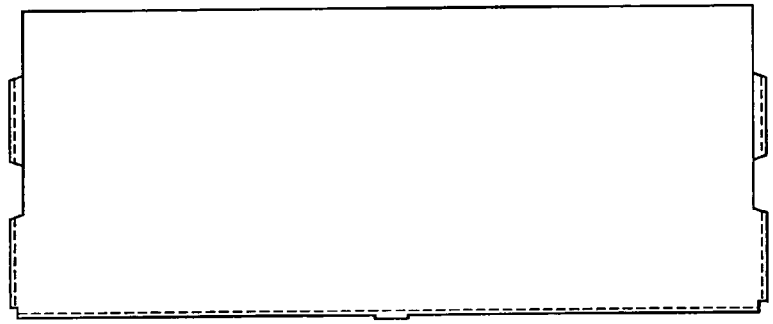 
FIG. 7B  FIG. 7C
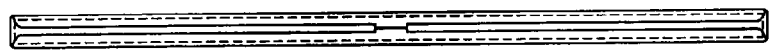
FIG. 7D

FIG. 8A
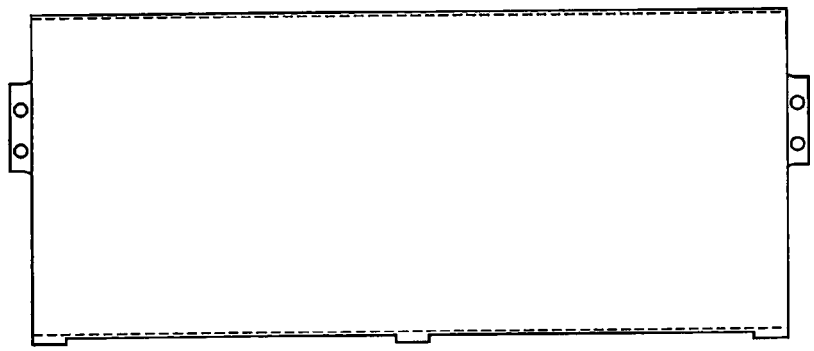 
FIG. 8B          FIG. 8C
FIG. 8D

| STATE OF COVER | SCHEMATIC VIEW | ENERGY RADIATED IN ALL DIRECTIONS | |
| --- | --- | --- | --- |
| | | 666MHz | 800MHz |
| GROUND LOCATION: CORNER PORTIONS<br>NUMBER OF GROUND LOCATIONS: 4<br>(FRONT AND BACK SURFACES) | 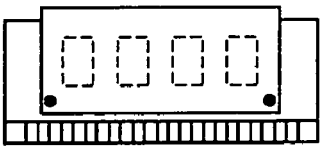 | 10.83 | 283.49 |
| GROUND LOCATION: CENTRAL PORTIONS ON SHORT SIDES<br>NUMBER OF GROUND LOCATIONS: 4<br>(FRONT AND BACK SURFACES) | 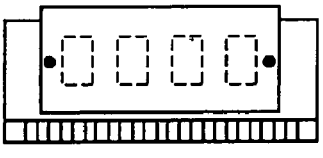 | 2.45 | 2.00 |
| GROUND LOCATION: CENTRAL PORTIONS ON SHORT SIDES & BETWEEN MEMORIES<br>NUMBER OF GROUND LOCATIONS: 10<br>(FRONT AND BACK SURFACES) | 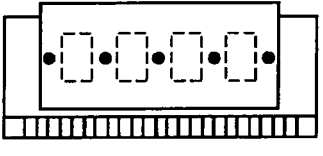 | 0.17 | 0.62 |
| NUMBER OF GROUND LOCATIONS: 16<br>(8 LOCATIONS x FRONT AND BACK SURFACES) | 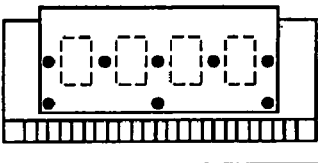 | 0.16 | 0.18 |

● GROUND LOCATION

FIG. 9

SEMICONDUCTOR DEVICE, NOISE REDUCTION METHOD, AND SHIELD COVER

This application claims priority to prior application JP 2004-150915, the disclosure of which is incorporated herein by reference.

BACKGROUND OF THE INVENTION

1. Field of the Invention

The present invention relates to semiconductor devices mounted on a memory module used in a computer apparatus and the like and on other multi-chip module, and the like, a method of reducing unnecessary radiation noises in the semiconductor device, and a shield cover used in the semiconductor device.

2. Description of the Related Art

Recently, as the size of a notebook computer and the like is reduced in the field of a computer industry, a memory module as a semiconductor module used as a main memory is made more dense and smaller in size. The memory module is a memory device having semiconductor memory chips mounted thereon at high densities so that they operate at a high speed. The memory module is required to mount a larger number of memory chips in the limited mounting area thereof. Therefore, some products have chip size packages (hereinafter, abbreviated as CPS) having a smaller mounting area, tape carrier packages of a thinner type (hereinafter, abbreviated as TCP), and the like mounted thereon instead of conventional thin small out-line packages (TSOP).

On the other hand, as the performance of computers is enhanced, the bus speed of a main memory is increased. Further, as the operating frequency of a memory module is also increased, a serious problem arises in that electromagnetic noises are unnecessarily radiated from the memory module.

In the memory module on which the CSPs and the TCPs are mounted, semiconductor chips are sealed to a thin substrate or a film tape. However, since the semiconductor chips having such arrangement are less resistant to external stress and the like as well as require consideration to a heat dissipation effect. Consequently, the semiconductor chips must be covered with a shield cover formed of a suitable raw material such as metal.

Japanese Unexamined Patent Application Publication No. 2000-251463 (hereinafter, referred to as a patent document 1) discloses a typical example of the above technology. In the example, a shield sheet is formed by laminating at least an adhesive sheet and an aluminum sheet, bonded on the upper surfaces of memory chips and the upper surface of a printed circuit substrate so as to cover semiconductor memory chips to thereby electromagnetically shield the semiconductor memory chips as well as fix them to the printed circuit substrate. It is assumed that when this technology is used, since the electromagnetic noises radiated from the memory chips are shielded by the aluminum sheet and further the memory chips are fixed by the adhesive sheet, occurrence of faulty connection due to vibration can be suppressed and further a heat dissipation effect can be expected by causing the aluminum sheet to act as a heat sink.

However, the following problems still remain to effectively reinforce and electromagnetically shield the memory module having high density and high speed in correspondence to the recent computer technology.

First, in the technology disclosed in the above-mentioned patent document 1 in which the shield sheet is formed by laminating the adhesive sheet and the aluminum sheet and bonded on the upper surfaces of the memory chips and the upper surface of the printed circuit substrate so as to cover the semiconductor memory chips to thereby electromagnetically shield the memory chips as well as fix them to the printed circuit substrate, drawbacks arise in that distortion is liable to be caused by bonding due to the difference of the thermal expansion coefficients between the memory module and the shield sheet and that it is difficult to secure a heat dissipation property and a bonding surface area. In order to prevent these drawbacks, a shield method is required to more reduce an area in contact with a circuit substrate or memory chips.

Further, from the view point of mechanical strength, a memory module, in which memory chips are covered with a shield cover, namely, with a metal cover as disclosed in the patent document 1, has high mechanical strength, and thus this memory module is more preferable in mechanical strength than a memory module that is not covered with a shield cover.

However, as a result of studies, the inventors have found that, when a memory module operates at a high speed, electromagnetic noises are radiated more seriously when the memory module has a floating-state shield cover covering circuits than when the memory module has no shielding (that is, when circuits are not covered with the shield cover).

This is because the shield cover itself acts as a patch type antenna. It is assumed preferable to totally fix the shield to a reference potential in order to prevent this drawback. Specifically, in order to reduce the electromagnetic noises radiated from a shield cover, it is preferable to shield the noises radiated from a memory module. For this purpose, it is preferable to connect the entire portions of a circuit substrate in contact with the shield cover to the reference potential. However, it is difficult to actually apply this connection to a product. This is because it is necessary to form a ground pattern on the circuit substrate in correspondence to the contact surface of the shield cover to connect the shield cover to the reference potential in its entirety. However, the ground pattern cannot be form on the circuit substrate around the entire periphery of the shield cover because signal lines are formed on the substrate. Further, it is also difficult to cause the substrate to bring into contact with the entire periphery of the shield cover because of the structural problem of the shield cover. Moreover, even if the substrate is forcibly caused to bring into contact with the entire periphery of the shield cover, distortion is caused by the difference of thermal expansion coefficients due to the increased contact area thereof.

Further, as apparent from the above description, since the mechanism of noises radiated from the memory module is obscure, an effective installation method is not apparent. Accordingly, it has been found that when a memory module is operated in a frequency of, for example, 133 MHz or more in the state that the shield cover is grounded in an arbitrary portion, electromagnetic noises are radiated more than those in a floating state in a high frequency region of 666 MHz and the like as the harmonic component of the frequency.

SUMMARY OF THE INVENTION

An object of the present invention is to provide a noise reduction method of reducing noises radiated from a semiconductor module by clarifying the mechanism of noises radiated from the semiconductor module, in particular, from a memory module.

Another object of the present invention is to provide a noise reduction method of reducing unnecessary radiation noises in a high frequency operation while securing thermal and mechanical strength in a semiconductor module on which CSP or TCP semiconductor memory chips are mounted.

Still another object of the present invention is to provide a semiconductor module, in particular, a memory module capable of reducing unnecessary radiation noises in a high frequency operation while maintaining thermal and mechanical strength.

Another object of the present invention is to provide a shield cover capable of reducing unnecessary radiation noises in a semiconductor module, in particular, in a memory module.

According to the present invention, it is provided a semiconductor module such as a memory module having a plurality of memory chips mounted on a circuit substrate. The semiconductor module includes a conductive shield cover, signal lines disposed on the circuit substrate and connecting the semiconductor chips to each other, and reference potential connection terminals disposed on the signal lines interposed between the respective semiconductor chips on the circuit substrate or on the extension lines extending from the signal lines, and the reference potential connection terminals are connected to the shield cover at a plurality of locations.

Specifically, in the memory module having the plurality of semiconductor chips mounted on the circuit substrate, a metal cover that constitutes the shield cover covers the semiconductor memory chips and comes into point or surface contact with reference potential (ground or power source) patterns on the upper surface of the circuit substrate at a plurality of locations to thereby electromagnetically shield the semiconductor memory chips. With this structure, although currents induced by an LSI operation flow in the metal cover, the metal cover is fixed to the circuit substrate in contact therewith so that the induction currents flow in the directions where they are dispersed or cancelled each other.

According to the above structure, since connection points to a reference potential are effectively disposed along the signal lines, feedback currents, to which the currents are fed back, flow through paths having short distances thereto (small loops) and near to the paths of signals. As a result, the magnetic fields formed by the feedback currents are cancelled each other, thereby electromagnetic waves are less radiated to the outside, and thus a low EMI module can be arranged.

In the present invention, since the potential of the metal protection cover (that is, the shield cover) can be set nearer to the reference potential, the shield cover and the substrate of the memory module are unlike to act as a patch type antenna, thereby unnecessary electromagnetic radiation can be reduced. Further, although the currents induced by the LSI operation flow in the metal cover, since the grounding points of shield cover are set such that the induction currents are dispersed and directed in the same direction as that of the control system signals, the unnecessary electromagnetic radiation resulting from the currents can be more reduced.

BRIEF DESCRIPTION OF THE DRAWINGS

FIGS. 1A and 1B are views explaining a structure used in a memory module with a conventional metal cover, wherein FIG. 1A is an upper surface view showing a state in which the metal cover is attached, and FIG. 1B is an upper surface view of a state in which the cover is removed;

FIGS. 3A, 3B, and 3C are views explaining a semiconductor module according to an embodiment of the present invention, wherein FIG. 3A is an upper surface view showing a state in which a metal cover is attached, FIG. 3B is an upper surface view of a state in which the cover is removed, and FIG. 3C shows an example of a contact part with a spring property for connecting the cover to a substrate;

FIGS. 7A, 7B, 7C, and 7D are a front elevational view, a plan view, a sectional view, and a rear elevational view showing an example of a cover structure used in the semiconductor module according to the present invention;

FIGS. 8A, 8B, 8C, and 8D are a front elevational view, a plan view, a sectional view, and a rear elevational view showing another example of the cover structure used in the semiconductor module according to the present invention; and FIG. 9 is a view explaining an effect of grounding according to the present invention.

DESCRIPTION OF THE PREFERRED EMBODIMENTS

Embodiments of the present invention will be described below in detail with reference to the drawings.

Figure 3A:
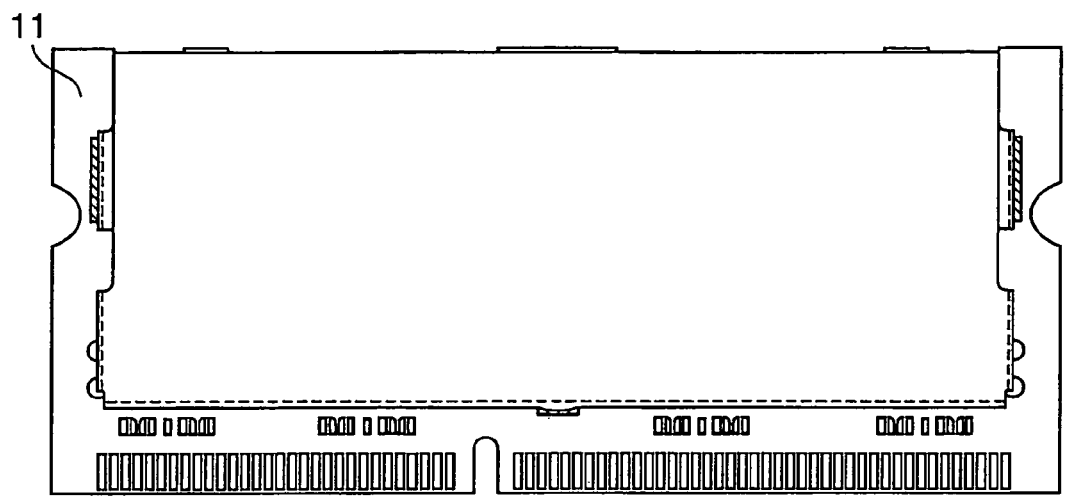
Figure 3B:
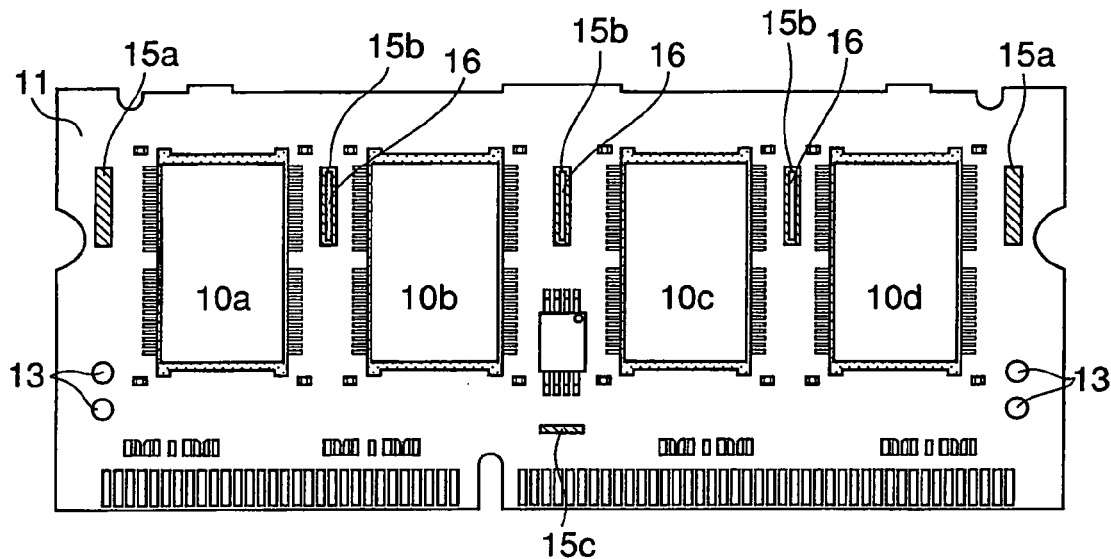
Figure 3C:

FIGS. 3A, 3B, and 3C show a memory module as an example of a semiconductor module according to an embodiment of the present invention.

FIG. 3A is a plan view of the memory module of the present invention having a shield cover 12 with a conductive member mounted on a circuit substrate 11, and FIG. 3B is a plan view of the memory module of the present invention in which the shield cover 12 is removed from the circuit substrate 11. Further, FIG. 3C is a sectional view of a contact part 16 for electrically connecting the shield cover 12 of the present invention to a reference potential on the circuit substrate 11, and the contact part 16 constitutes a metal cover connection conductor.

As shown in FIGS. 3A and 3B, the memory module of the present invention includes the circuit substrate 11, a plurality of semiconductor memory chips 10 mounted on the circuit substrate 11, and the metal shield cover 12, namely, the protection cover 12 disposed so as to cover the semiconductor memory chips 10.

The circuit substrate 11 may be any shield cover as long as it is ordinarily used to a memory module, and, for example, a printed substrate composed of an insulation substrate of glass epoxy and the like and having wiring patterns of copper and the like formed thereon may be used as the circuit substrate 11. Further, a plurality of types of wirings (not shown) are formed in the circuit substrate 11 in the form of multi-layer wirings. These wirings include various types of signal lines in addition to power source lines, ground lines, and the like. These signal lines include clock signal lines, address signal lines, and control signal lines as the control system signal lines of the memory module.

A plurality of the semiconductor memory chips 10 are mounted on the circuit substrate 11 containing the multi-layer wirings therein by a mounting method such as of TCP. Basically, the control system signals described above are commonly wired to the plurality of semiconductor memory chips 10 mounted on the circuit substrate 11. Although the package structure of the semiconductor memory chips 10 is not particularly limited, for example, it has such a structure that a silicon substrate comprising memory devices such as DRAMs is sealed to an insulation tape of polyimide and the like by epoxy resin.

Further, as shown in FIG. 3B, fixing holes 13 are formed to the lower portion of the circuit substrate 11 on both the right and left sides thereof to fix the shield cover 12. The illustrated fixing holes 13 are also useful as connection patterns to the reference potential.

Figure 2:
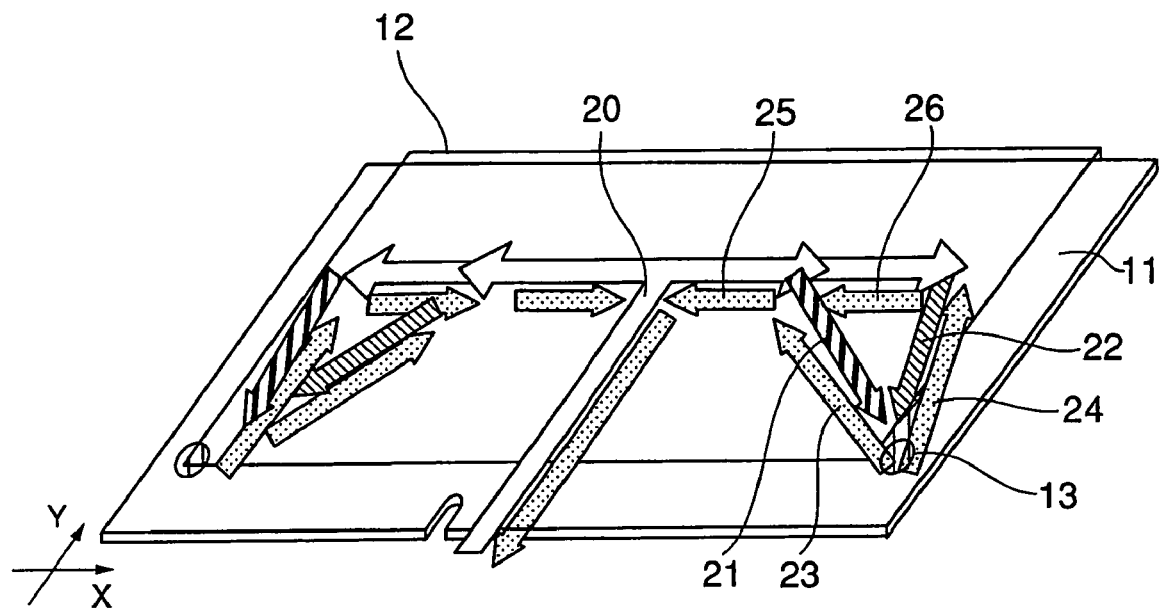
FIG. 2 is a view explaining current loops formed by control system signals when the portions, in which the conventional metal cover is connected to a circuit substrate is, disposed to corner portions of the circuit substrate.

The wirings in the circuit substrate 11 shown in FIGS. 3A and 3B will be specifically explained with reference to FIG. 2. FIG. 2 shows the structure of a memory module called a small outline dimm (hereinafter, abbreviated as SODIMM) as an example of the semiconductor module. The memory module has the plurality of semiconductor memory chips 10 mounted on both the sides of the circuit board 11. The respective semiconductor memory chips 10 of the memory module (SODIMM) shown in FIG. 2 are electrically connected to a contact pad 17 called a J-box disposed to the lower end of the circuit board 11 through various types of wirings and electrically connected to a mother board (not shown) by inserting the contact pad 17 into a socket. The disposition of the pins of the contact pad 17 is uniquely defined, that is, the wirings 20 of the control system signals (clock signal, address signal, control signal) for controlling memories are intensively disposed at the central portion of the circuit substrate 11, branched to the right and the left from the central portion of the circuit substrate 11, and connected to the respective semiconductor memory chips 10. In other words, the control system signal lines are commonly used by the semiconductor memory chips 10.

Figure 4:
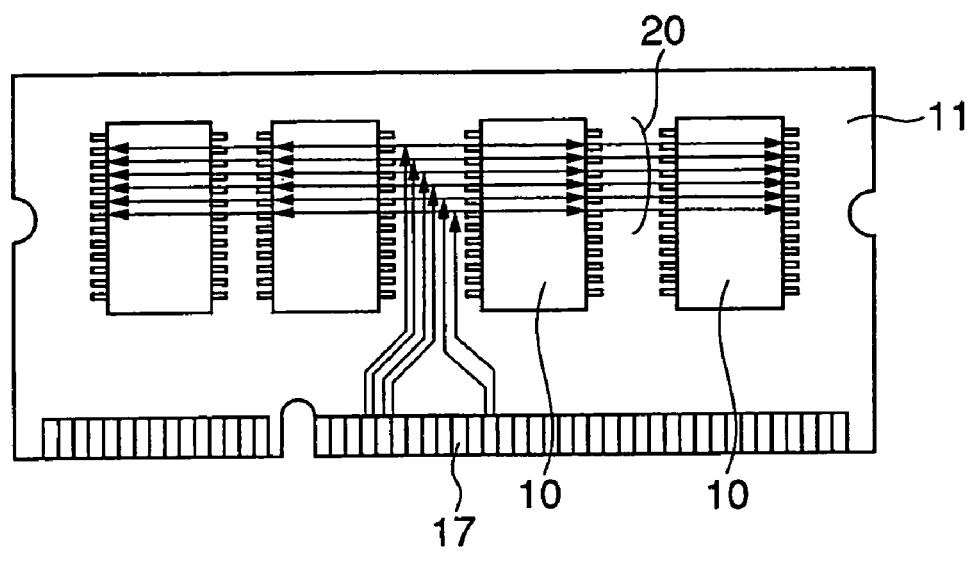
FIG. 4 is a view showing current loops formed by control system signals in the memory module shown in FIG. 1.
Figure 4:
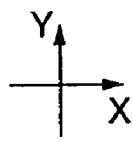

As shown in FIG. 4, when an X-axis and a Y-axis are set on the memory module, currents resulting from the control system signals flowing through the semiconductor memory chips 10 disposed on the circuit substrate 11 first flow in a Y-direction and then flow in an X-direction.

Figure 1A:
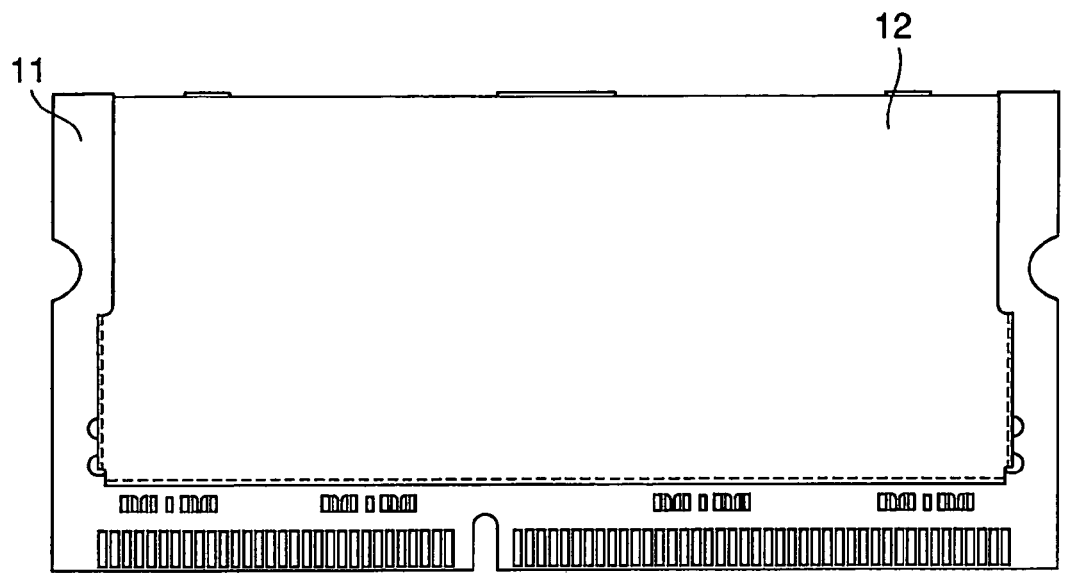
Figure 1B:
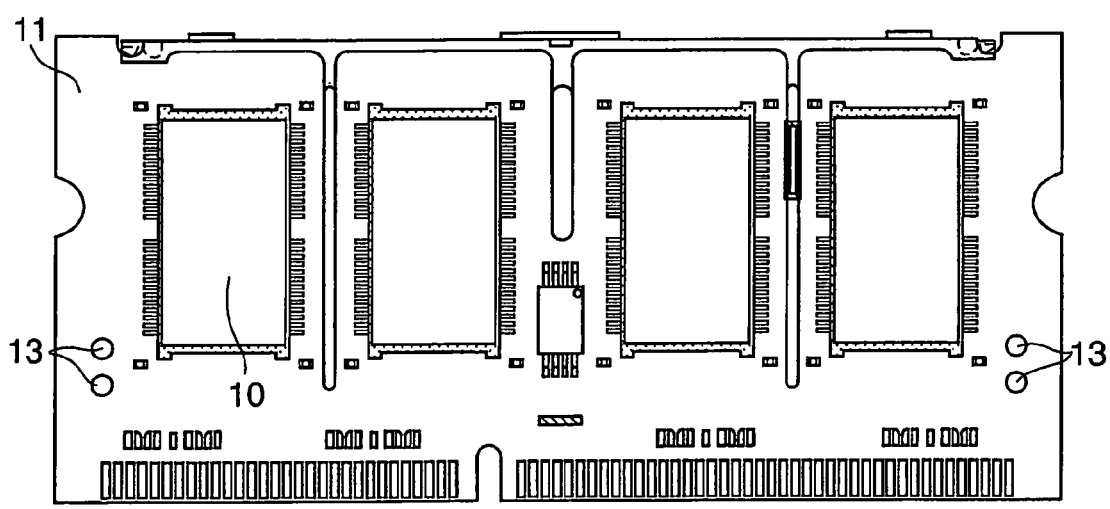

In order to make the present invention understood easily, a conventional memory module shown in FIGS. 1A and 1B will be explained with reference to FIG. 2. As shown in FIG. 1A, the conventional memory module includes a circuit substrate 11 and a shield cover 12 likewise the memory module shown in FIG. 3A. Further, as shown in FIG. 1B, the conventional memory module has cover fixing holes 13 formed to the lower portion of the circuit substrate 11 on both the right and left sides of the corners thereof, and the shield cover 12 is connected to a reference potential, for example, a ground potential through the cover fixing holes 13. It has been found that when the shield cover 12 is connected only to the corner portions of the circuit substrate 11 as described above, unnecessary electromagnetic radiation is generated.

A result of examination executed to find a cause of the unnecessary electromagnetic radiation will be explained. First, a case, in which the shield cover 12 electrically floats, will be explained. In this case, unnecessary electromagnetic radiation is generated by being induced to the shield cover 12 by the electrostatic bonding between the circuit substrate 11 and the shield cover 12. Two conductor plates having a different size such as the shield cover 12 and the ground conductor plate of the circuit substrate 11 constitute a patch type antenna acting as an effective radiation source.

In contrast, it has been found that when the shield cover 12 is connected to the reference potential only through the corner portions as shown in FIG. 1, unnecessary electromagnetic radiation is generated more than the case in which the shield cover 12 electrically floats. Specifically, it has been confirmed that when the shield cover 12 is unsuitably connected to the reference potential, the unnecessary electromagnetic radiation is increased.

When control system signal currents flow to the wirings 20 in a state that the shield cover 12 is connected to the reference potential only through the fixing holes 13 of the corner portions, currents are induced to the shield cover 12 as shown in FIG. 2. Specifically, it has been found that although induction currents and feedback currents resulting from the currents flowing through the control system signal lines flow through reference potential layers 13 and through a conductor forming the shield cover 12, when the reference potential is applied through a small number of ground points, there are formed portions in which the induction currents of the shield cover 12 are concentrated. Thus, strong magnetic fields are formed in the vicinity of the concentrated portions, and consequently, unnecessary radiation becomes stronger than the case of the floating inversely.

In more detail, the currents of the conventional control system signals in the conventional case shown in FIG. 2 include the currents of the control system signals, the induction currents of the respective semiconductor memory chips 10 flowing through the shield cover 12, and the feedback currents flowing in the reference potential of the circuit substrate 11. In the illustrated example, the reference potential connection points 13 in the shield cover 12 and in the circuit substrate 11 are disposed in the corner portions of the shield cover 12 spaced apart from the control system signal lines 20. As a consequence, the currents flowing through the control system signal lines 20 shown by outline arrows induce currents to the shield cover 12, and the induced currents flow in a-Y-direction with respect to the connection points, namely, to the fixing holes 13. In FIG. 2, the current paths of the induction currents induced by the two semiconductor memory chips 10 shown in FIG. 3 are shown by reference numerals 21 and 22, and the feedback currents of them are shown by reference numerals 23 and 24, respectively. Further, the feedback currents with respect to the control system signal currents in the two semiconductor memory chips 10 are shown by reference numerals 25 and 26.

As apparent also from FIG. 2, when the connection points 13 are disposed to the corner portions, the currents have a large loop, and, in particular, the induction currents flowing through the shield cover 12 have current components in the Y-direction. The respective currents in the X-direction are branched to the right and the left from the central portion of the circuit substrate 11, thereby the direction of magnetic fields are reversed on both the right and left sides of the memory module. When the respective currents are viewed from a distance, since they act in directions in which they are canceled each other, they are unlike to generate the unnecessary radiation. On the other hand, since the induction currents in the Y-direction do not have the symmetric property as described above, they act as a factor of unnecessary radiation. Accordingly, it has been found that the connection points 13 of the shield cover 12 greatly affect radiation.

Specifically, although the currents in the shield cover 12 flow in the X- or Y-direction, the noises generated from the respective currents in the X-direction as the lengthwise direction of the memory module act such that they are cancelled each other in the distance, and thus they are unlike to become radiation sources. However, since the noises generated from the currents in the Y-direction do not cancel each other and become radiation sources of electromagnetic waves resulting from the currents flowing in the Y-direction. Thus, strong radiation noises are generated from the currents.

According to the experiments executed by the inventors, it has been found that there are portions in which the difference between the potentials (electric fields) of the shield cover 12 and the conductor of the reference potential of the circuit substrate 11 are relatively small and unnecessary electromagnetic radiation is reduced by suitably selecting the positions at which the shield cover 12 is connected to the reference potential of the circuit substrate 11. Further, it has been also found that since the potential of the shield cover 12 can be made nearer to the reference potential by increasing the number of the connection points of the circuit substrate 11 to the shield cover 12, the shield cover 12 and the circuit substrate 11 are unlike to act as the patch type antenna, thereby the unnecessary electromagnetic radiation can be more reduced.

In view of the points described above, the inventors have found that the unnecessary electromagnetic radiation can be greatly reduced by suitably selecting the reference potential connection points between the shield cover 12 and the circuit substrate 11 and increasing the number of the points.

Returning to FIGS. 3B and 3C, the memory module according to the embodiment of the present invention includes not only reference potential connection patterns disposed to the connection points 13 of the corner portions but also the reference potential connection patterns 15a of the circuit substrate 11 are disposed just above the control system signal lines 20 of the semiconductor memory chips 10a and 10d on both the right and left ends of the four semiconductor memory chips 10. In addition, the reference potential connection patterns 15b of the circuit substrate 11 are disposed also on the extension lines extending from the control system signal lines between the semiconductor memory chips 10a and 10b, 10b and 10c, and 10c and 10d. Further, the reference potential connection pattern 15c of the circuit substrate 11 is also disposed on the control system signal lines in the central portion of the circuit substrate 11.

As shown in FIG. 3C, a contact part 16 is inserted in each of the reference potential connection patterns 15b of the circuit substrate 11 so as to electrically connect the shield cover 12 to the reference potential of the circuit substrate 11.

In this structure, since the potentials of the semiconductor memory chips 10 themselves are actually varied by control system signal simultaneously switching noises and the like, currents are induced to the shield cover 12 through the capacitance between the semiconductor memory chips 10 and the shield cover 12. When the shield cover 12 is connected to the reference potential of the circuit substrate 11, the currents flow through the shield cover 12 (21) and reach the connecting positions 15a and 15b.

Figure 5:
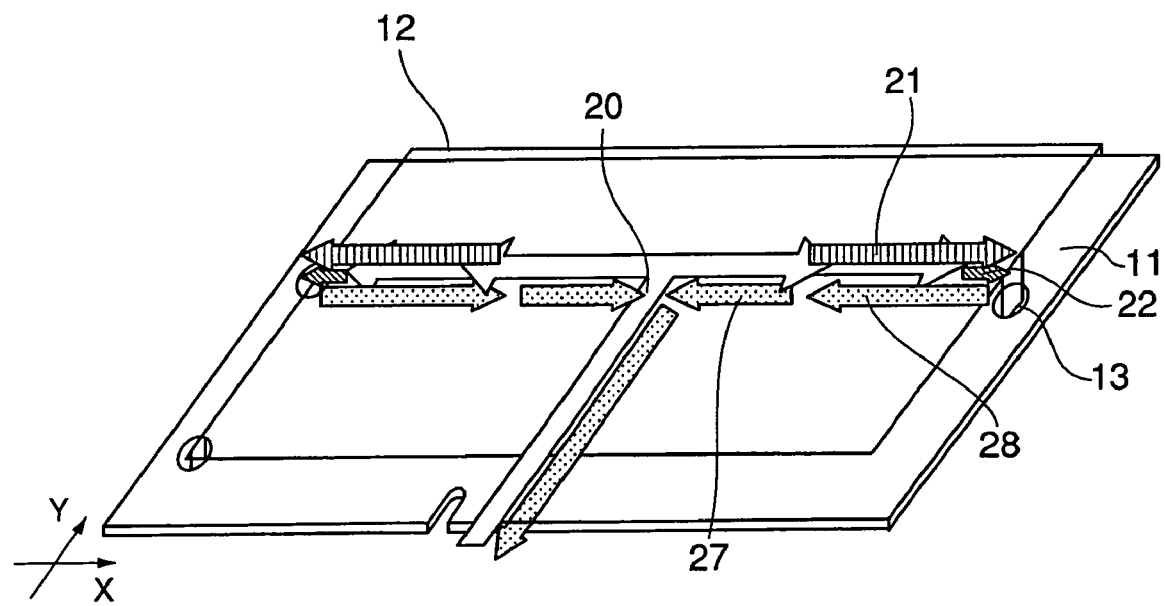
FIG. 5 is a view showing current flows formed by the control system signals in the present invention.

Referring to FIG. 5, in the memory module shown in FIG. 1, the connection points 15a, 15b, and 15c of the shield cover 12 to the circuit substrate 11 are disposed along the current path 20 of the control system signals so that electromagnetic radiation noises can be reduced.

In other words, in the example having the connecting portions of the shield cover 12 disposed in the vicinity of the terminal ends of the control system signal flows as shown in FIG. 5, the induction currents 20 and 21 flowing though the shield cover 12 and the feedback currents 27 and 28 flowing though the circuit substrate 11 flow through the paths along signal lines and are composed almost of X-directional components. Accordingly, even if the feedback currents have a large loop, radiated noises are cancelled each other. Specifically, the current paths 21 and 22 of the currents, which are induced from the respective semiconductor memory chips 10a-10d to the shield cover 12, the Y-component currents of the feedback currents 27 and 28 of the above currents, and the loops of the feedback currents are reduced as mush as possible, and the feedback currents are also caused to flow through the current paths 21 and 22. With this operation, since the respective currents are concentrated in the X-direction, the noises generated therefrom act to be cancelled each other in the distance. As a result, unnecessary electromagnetic radiation can be reduced.

Figure 6A:
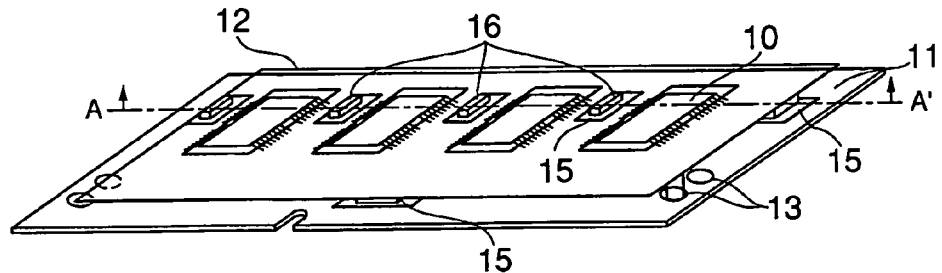
FIGS. 6A and 6B are a perspective view and a sectional view explaining the structure of a semiconductor module according to an embodiment of the present invention, respectively.
Figure 6B:
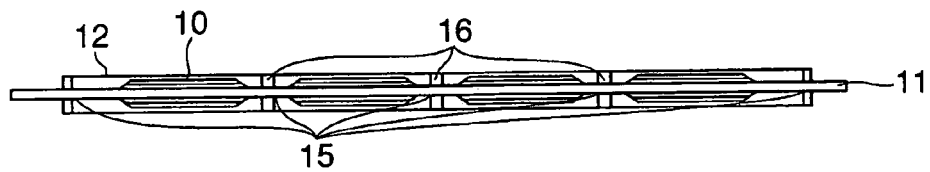
Figure 6C:
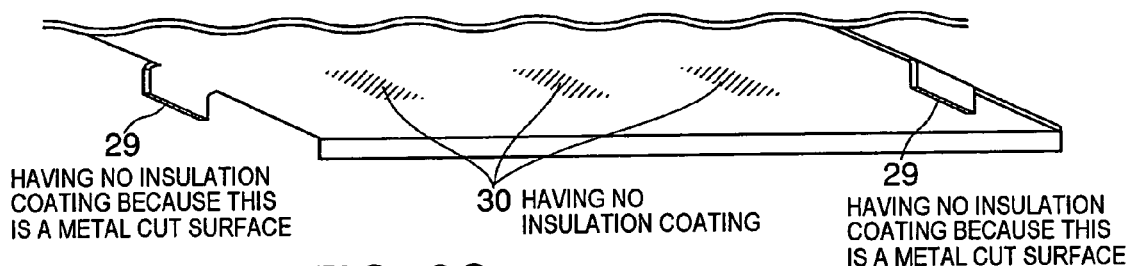
FIGS. 6C and 6D are perspective views showing an example of a metal cover used in the semiconductor module according to the present invention.
Figure 6D:
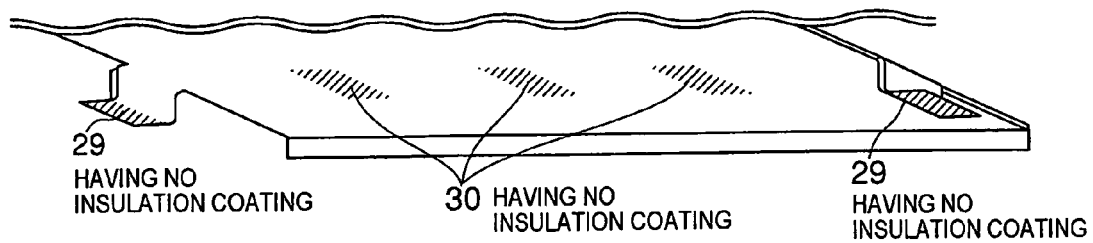

Referring to FIGS. 6A to 6D, the grounding mode of the shield cover 12 used in the embodiment of the present invention will be explained. FIGS. 6A and 6B are a perspective view and a sectional view of the structure of the memory module according to the embodiment of the present invention, respectively. Further, FIG. 6C is a perspective view of an embodiment of the shield cover 12 of the memory module, and FIG. 6D is a perspective view of another embodiment of the shield cover 12 of the memory module.

In FIG. 6A, the insides of the fixing holes 13 are plated with metal and conduct to the reference potential (the ground or a power source) of the memory module. Accordingly, the shield cover 12 is fixed to the substrate by being inserted into the connection points 13 and as well as the portions of the surface or the section of the shield cover 12 to which no insulation coating is applied come into contact with the plated portions of the fixing holes 13. Thus, the potential of shield cover 12 is set to the reference potential of the memory module. Further, the number of the reference potential connection points is increased by electrically connecting the patterns of the ground positions 15a, 15b, and 15c of the circuit substrate 11 to the shield cover 12 through the contact parts 16 disposed on the circuit substrate 11.

On the other hand, the shield cover 12 shown in FIGS. 6C and 6d has a member composed of metal and an insulation film for covering the member. The shield cover 12 has an inside portion 30 confronting the semiconductor memory chips 10 and connected to the contact parts 16, and the insulation of the portion 30 is removed as well as the insulation of both the right and left end portions 29 of the shield cover 12 to be connected to the circuit substrate 11 is also removed.

FIGS. 7A, 7B, 7C, and 7D show an example of a metal cover according to the present invention. The illustrated metal cover is formed by processing a single stainless steel sheet and fixed to the circuit substrate 11 so as to cover the plurality of memory chips mounted on both the surfaces of the circuit substrate 11. Further, the metal cover is in contact with the contact parts 16 mounted on the circuit substrate 11 at the central portion thereof on order to prevent the deflection of the metal cover. In the figures, the metal cover has a spring property so as to secure sufficient strength when it is fixed to the circuit substrate 11 and fixed on the circuit substrate 11 by being meshed with the fixing holes 13 of the circuit substrate 11 so as to sandwich the circuit substrate 11 between in the insides thereof.

As long as the illustrated metal cover can protect the memory chips from external mechanical stress, shield electromagnetic noises and further serve as a heat sink, the material and the thickness thereof are not particularly limited. Other metal (for example, copper) may be also used instead of stainless steel. Further, insulation coating is applied to the surface of the metal cover or an insulation material is bonded thereon, and coating is also applied to the inside thereof in order to prevent shot circuit. However, the insulation coating or the insulation material is removed from the portions of the metal cover to be connected to the reference potential of the circuit substrate 11 as described above.

It is noted here that, although the example, in which the metal cover is processed from the single stainless steel sheet and the substrate is sandwiched therein, is shown in the embodiment, this structure is an only example and the metal cover is not limited to the structure.

For example, two metal covers may be fixed to the substrate from the front and back surfaces thereof with such a structure as shown in FIG. 8.

Next, an effect of the grounding according to the present invention will be explained with respect to FIG. 9.

FIG. 9 is a table showing a result of simulation of the energy radiated from electromagnetic noises when a memory module actually operating at a high speed and having a shield cover is grounded at arbitrary positions. In the simulation, the memory module was operated in the frequency of 133 MHz, and FIG. 9 shows energy radiated in all directions (W) at the time in the frequencies of 666 MHz and 800 MHz. The values shown here are standardized by setting the energy radiated when the shield cover was placed in a floating state to 1. As apparent from FIG. 9, when the shield cover was grounded in the corner portions, energy of 10.83 and 283.49 was radiated. On the other hand, the radiated energy could be greatly reduced by increasing the number of the grounding portions 10 to the 10 portions and to the 16 portions.

As apparent also from FIG. 9, it can be found that the electromagnetic radiation noises are differently radiated depending on connecting places. According to the present invention, this is because the radiation is caused by the Y-components of the induction currents flowing through the cover and the Y-components of the feedback currents flowing in the reference potential when the shield cover is connected to the circuit substrate.

Other Embodiments of the Invention

As other embodiments of the present invention, although the basic arrangement thereof is similar to the embodiment described above, the method described above solves the problems by reducing the feedback currents of the cover by reducing the capacitance between the memory chips mounted on the substrate and the metal cover. Further, when the metal cover is grounded, it is premised to simply connect the metal cover to the ground. However, the radiation of electromagnetic waves is a phenomenon of a high frequency, the problem can be also coped with by the connection making use of high frequency in place of the simple connection. For this purpose, resistances or capacitances may be applied to the contact points by sandwiching resistors or capacitors between the reference potential patterns and the shield cover. It has been confirmed by the simulation executed by the inventors that the energy radiated in all directions is reduced in this case.

Further, it is also possible to increase the distance between the memory chips and the metal cover, that is, to separate the memory chips from the cover as mush as possible by increasing the thickness of the cover in a Z-direction in order to reduce the capacitances between the memory chips and the metal cover.

As described above, the present invention can reduce the unnecessary radiation noises in the semiconductor devices mounted on the memory module and the like. Further, the present invention can obtain a semiconductor product characterized in low EMI. Moreover, the present invention can improve the resistance to interference noises of the memory module from the circumference thereof.

While the present invention has thus far been disclosed in conjunction with several embodiments thereof, it will be readily possible for those skilled in the art to put the present invention into practice in various other manners.

What is claimed is:

1. A method of reducing the noises of a semiconductor module comprising a circuit substrate having a plurality of types of wirings, a semiconductor device mounted on the circuit substrate, and a conductive shield cover that covers the semiconductor device, the method comprising:
    selecting the reference potential connecting position of the shield cover at a position relating to a specific wiring of the wirings of the circuit substrate to thereby reduce the noises radiated from the semiconductor module,
    disposing signal lines on the circuit substrate,
    connecting semiconductor chips to each other,
    disposing reference potential connection terminals above the signal lines interposed between the respective semiconductor chips on the circuit substrate or above extension lines extending from the signal lines, and
    connecting the reference potential connection terminals to the shield cover at a plurality of locations.

2. A method of reducing the noises of a semiconductor module according to claim 1, wherein:
    the specific wiring is built in the circuit substrate in the form of a multi-layer wiring together with the other wirings, and
    the noises are reduced by connecting the reference potential connecting position of the shield cover to a reference potential pattern formed on the upper surface layer of the specific wiring.

3. A method of reducing the noises of a semiconductor module according to claim 1, wherein:
    the specific wiring is built in the circuit substrate in the form of a multi-layer wiring together with the other wirings, and
    the noises are be reduced by connecting the reference potential connecting position of the shield cover to a reference potential pattern formed on the extension wiring extending from the terminal end of the specific wiring.

4. A method of reducing the noises of a semiconductor module according to claim 1, wherein:
    the wirings comprise a control system signal line to the semiconductor module, and
    the noises are reduced by selecting the reference potential connecting position of the shield cover at the position relating to the control system signal line.

5. A method of reducing the noises of a semiconductor module according to claim 4, wherein:

the reference potential connecting position of the shield cover is located along and adjacent to the control system signal line, and the noises are reduced by disposing a plurality of the reference potential connecting positions of the shield cover on the upper surface layers of the control system signal lines or on the upper surface layers of the extension wirings extending from the terminal ends of the control system signal lines.

6. A method of reducing the noises of a semiconductor module according to claim 1, wherein:

the noises are reduced by disposing a ground source pattern or a power source pattern to the reference potential connecting position of the shield cover.

7. A method of reducing the noises of a semiconductor module according to claim 1, wherein:

the semiconductor device is a memory chip.

8. A semiconductor module, comprising:

a circuit substrate including wirings, part of the wirings functioning as control system signal lines, a plurality of semiconductor devices mounted on the circuit substrate, and a conductive shield cover that covers the plurality of semiconductor devices, the shield cover being connected to a reference potential though a plurality of reference potential connecting positions, wherein the reference potential connecting positions of the shield cover are disposed on the upper portion of the circuit substrate, wherein the reference potential connecting positions of the shield cover are disposed to the ends of the control system signal lines of the semiconductor devices located outermost of the plurality of semiconductor devices, respectively and disposed on the circuit substrate of the control system signal line shared by the plurality of semiconductor devices so as to sandwich the respective semiconductor devices.

9. A semiconductor module according to claim 8, wherein:

the control system signal line is embedded in the circuit substrate in the form of a multi-layer wiring, and the reference potential connecting position of the shield cover is formed on the upper surface layer of the control system signal line in the circuit substrate.

10. A semiconductor module according to claim 8, wherein:

the control system signal line is embedded in the circuit substrate in the form of a multi-layer wiring, and the reference potential connecting position of the shield cover is formed on the circuit substrate to which an extension line extends from the terminal end of the control system signal line.

11. A semiconductor module according to claim 9, wherein:

the reference potential connecting position of the shield cover is disposed just above the control system signal line or just above the extension line, respectively.

12. A semiconductor module according to claim 8, wherein:

the plurality of semiconductor devices are a plurality of memory chips disposed in a row in series on the circuit substrate.

13. A semiconductor module according to claim 12, wherein:

the pattern of the reference potential connecting position of the shield cover on the circuit substrate is a ground pattern or a power source pattern.

14. A shield cover used to cover a semiconductor device mounted on a circuit substrate comprising an inside surface facing the semiconductor device and an outside surface as well as comprising a member formed of a conductive material and an insulation material layer covering the inside and outside surfaces of the member, wherein:

the insulation material layer is partially removed to thereby expose the conductive material, and the shield cover is connected to the ground patterns or the power source patterns on the circuit substrate through the exposed portions of the conductive material.

15. A shield cover according to claim 14, wherein:

the exposed portion of the conductive material is disposed at a plurality of positions.

16. A shield cover according to claim 14, wherein:

the exposed portion of the conductive material is connected to the circuit substrate through a resistor or a capacitor.

17. A semiconductor module, comprising:

a plurality of memory chips mounted on a circuit substrate, a conductive shield cover, signal lines disposed on the circuit substrate and connecting the semiconductor chips to each other, and reference potential connection terminals disposed above the signal lines interposed between the respective semiconductor chips on the circuit substrate or above extension lines extending from the signal lines, wherein the reference potential connection terminals are connected to the shield cover at a plurality of locations.

18. The semiconductor module according to claim 17, wherein:

the conductive shield cover is a metal cover that covers the semiconductor memory chips and comes into point or surface contact with reference potential patterns on an upper surface of the circuit substrate at a plurality of locations to thereby electromagnetically shield the semiconductor memory chips.

* * * * *